United States Patent

Thewes et al.

[11] Patent Number: 5,942,912
[45] Date of Patent: Aug. 24, 1999

[54] DEVICES FOR THE SELF-ADJUSTING SETTING OF THE OPERATING POINT IN AMPLIFIER CIRCUITS WITH NEURON MOS TRANSISTORS

[75] Inventors: Roland Thewes, Groebenzell; Werner Weber; Andreas Luck, both of Munich; Doris Schmitt-Landsiedel, Ottobrunn, all of Germany

[73] Assignee: Siemens Aktiengesellschaft, Munich, Germany

[21] Appl. No.: 08/900,119

[22] Filed: Jul. 25, 1997

[30] Foreign Application Priority Data

Jul. 25, 1996 [DE] Germany ............................ 196 30 111

[51] Int. Cl.⁶ .................................................. H03K 19/23
[52] U.S. Cl. ................................ 326/36; 326/35; 326/11; 326/119; 327/543
[58] Field of Search ................................. 326/35, 36, 11, 326/112, 119; 327/540, 543, 315, 38; 706/15, 16, 26

[56] References Cited

U.S. PATENT DOCUMENTS

| | | | |
|---|---|---|---|
| 4,004,164 | 1/1977 | Cranford, Jr. et al. ................. | 327/543 |
| 4,550,284 | 10/1985 | Sooch ..................................... | 323/315 |
| 5,311,115 | 5/1994 | Archer ................................... | 323/315 |
| 5,391,979 | 2/1995 | Kajimoto et al. ....................... | 326/313 |
| 5,587,668 | 12/1996 | Shibata et al. .......................... | 323/36 |
| 5,594,372 | 1/1997 | Shibata et al. .......................... | 326/121 |
| 5,608,340 | 3/1997 | Shibata et al. .......................... | 326/36 |
| 5,621,336 | 4/1997 | Shibata et al. .......................... | 326/36 |
| 5,644,253 | 7/1997 | Takatsu .................................. | 326/35 |

FOREIGN PATENT DOCUMENTS 0 516 847  9/1992  European Pat. Off. .
WO 95/15581  8/1995  WIPO .

OTHER PUBLICATIONS

IEEE Transactions on Electron Devices, vol. 39, No. 6, Jun. 1992, Tadashi Shibata et al, A Functional MOS Transistor Featuring Gate–Level Weighted Sum and Threshold Operations, pp. 1444–1455.

Primary Examiner—Michael Tokar
Assistant Examiner—James H. Cho
Attorney, Agent, or Firm—Hill & Simpson

[57] ABSTRACT

A defined zero point voltage ($V_0$), dependent on a settable zero point voltage target value ($V_{0,soll}$), is enabled in amplifier stages (1 . . . k) with neuron MOS transistors (T10,1 . . . T10,k). This is generally required because, for example, due to a process-caused charging of the floating gates of the neuron MOS transistors, and due to a capacitively coupled-in voltage from the channel region, an undefined zero point displacement of the transmission characteristic curve results. The devices can be used together with the amplifier stages, e.g. in video and audio technology, in sensor technology, in analog computers, in fuzzy circuits and in neural networks.

6 Claims, 6 Drawing Sheets

FIG 2
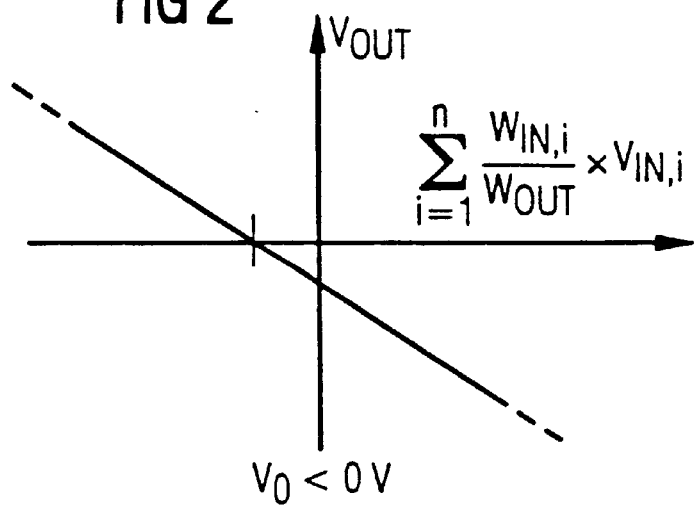
$V_0 < 0 \text{ V}$
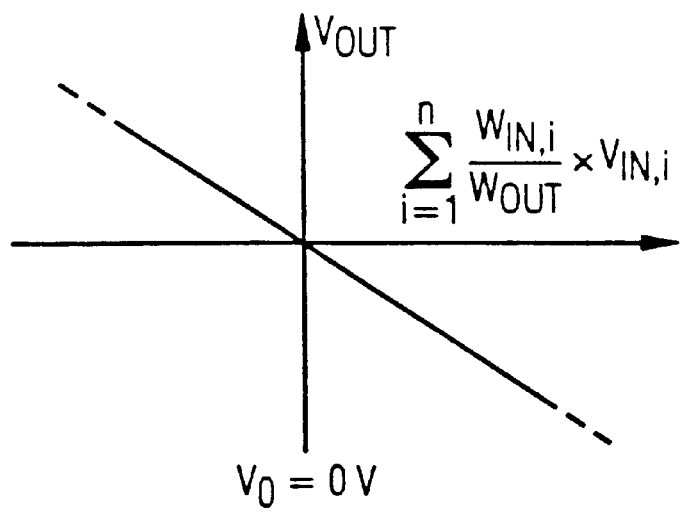
$V_0 = 0 \text{ V}$
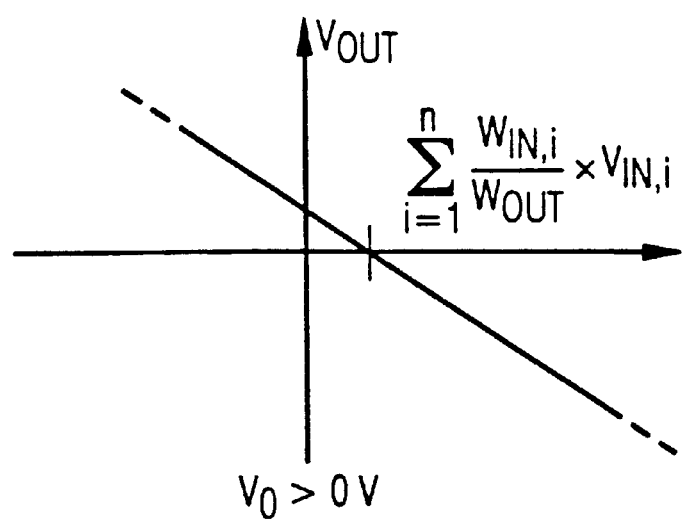
$V_0 > 0 \text{ V}$

DEVICES FOR THE SELF-ADJUSTING SETTING OF THE OPERATING POINT IN AMPLIFIER CIRCUITS WITH NEURON MOS TRANSISTORS

BACKGROUND OF THE INVENTION

In particular for amplifier circuits that are linear with respect to the large signal and that have neuron MOS transistors, there is a great potential for many analog circuit applications, such as for example video and audio applications, sensor technology, analog computers, fuzzy circuits and neural networks.

From the IEEE Transactions on Electron Devices, vol. 39, no. 6, June 1992, the construction and manner of functioning of a neuron MOS transistor and its use as an amplifier are known.

If, using a neuron MOS transistor, an amplifier, or, respectively, summing amplifier, is realized that is linear with respect to the large signal, as a rule it exhibits in its transmission characteristic curve an undefined zero point displacement or, respectively, a displacement of the operating point, which for example is due to a process-caused charging of the floating gate of the neuron MOS transistor.

SUMMARY OF THE INVENTION

It is an object of the invention to provide devices in which, in at least one such amplifier stage, a defined zero point voltage, dependent on a settable target value for the zero point voltage, is enabled with the smallest possible component outlay.

In general terms, the present invention is a device for self-adjusting setting of the operating point in amplifier circuits with neuron MOS transistors. An adjustment stage and at least one amplifier stage, of essentially identical construction thereto, are provided. Each have a series circuit of an MOS field effect transistor and a neuron MOS transistor. All gates of the MOS transistors are connected with a common voltage source. The adjustment stage and the at least one amplifier stage are connected such that an equally large current flows through them. Input gates of the neuron MOS transistor belonging to the adjustment stage, which gates represent amplifier inputs in the at least one amplifier stage of essentially identical construction, are connected with reference potential. A feedback gate of the neuron MOS transistor belonging to the adjustment stage is connected with a voltage source that supplies a target value for the zero point voltage of the at least one amplifier stage. The transistor is fed back to an output of the respective amplifier stage in the at least one amplifier stage of essentially identical construction.

Advantageous developments of the present invention are as follows.

An equally large current in the adjustment stage and in the at least one amplifier stage is produced by providing a multiple current mirror with an input and at least one output. The input of the multiple current mirror is connected to the adjustment stage. One of the at least one outputs of the multiple current mirror is connected to a respective amplifier stage.

An equally large current is produced in the adjustment stage and in the at least one amplifier stage by providing a multiple current mirror or a current source circuit with an input, a first output and at least one additional output. The input of the multiple current mirror or of the current source circuit is connected to the one current source that supplies the current. The adjustment stage is connected to the first output of the multiple current mirror or the current source circuit. One of the at least one further outputs of the multiple current mirror or of the current source circuit is connected to a respective amplifier stage. The neuron MOS transistors of the adjustment stage and of the at least one amplifier stage has an additional adjustment gate that is connected with the output of the adjustment stage.

Using electronic switches one of the at least one amplifier stages is switched at regular time intervals as an adjustment stage, whereby the input gates of the neuron MOS transistor can be switched selectively either to inputs of the amplifier stage or to reference potential. An adjustment gate of the neuron MOS transistor can be switched to an internal output of the amplifier stage and a feedback gate can be switched to a voltage source with the target value of the zero point voltage. The internal output can be switched to the feedback gate and to an external output of the amplifier stage.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 2 shows a schematic representation of the transmission behavior of the amplifier from FIG. 1, for the explanation of the zero point displacement;

DETAILED DESCRIPTION OF THE PREFERRED EMBODIMENTS

Figure 1:
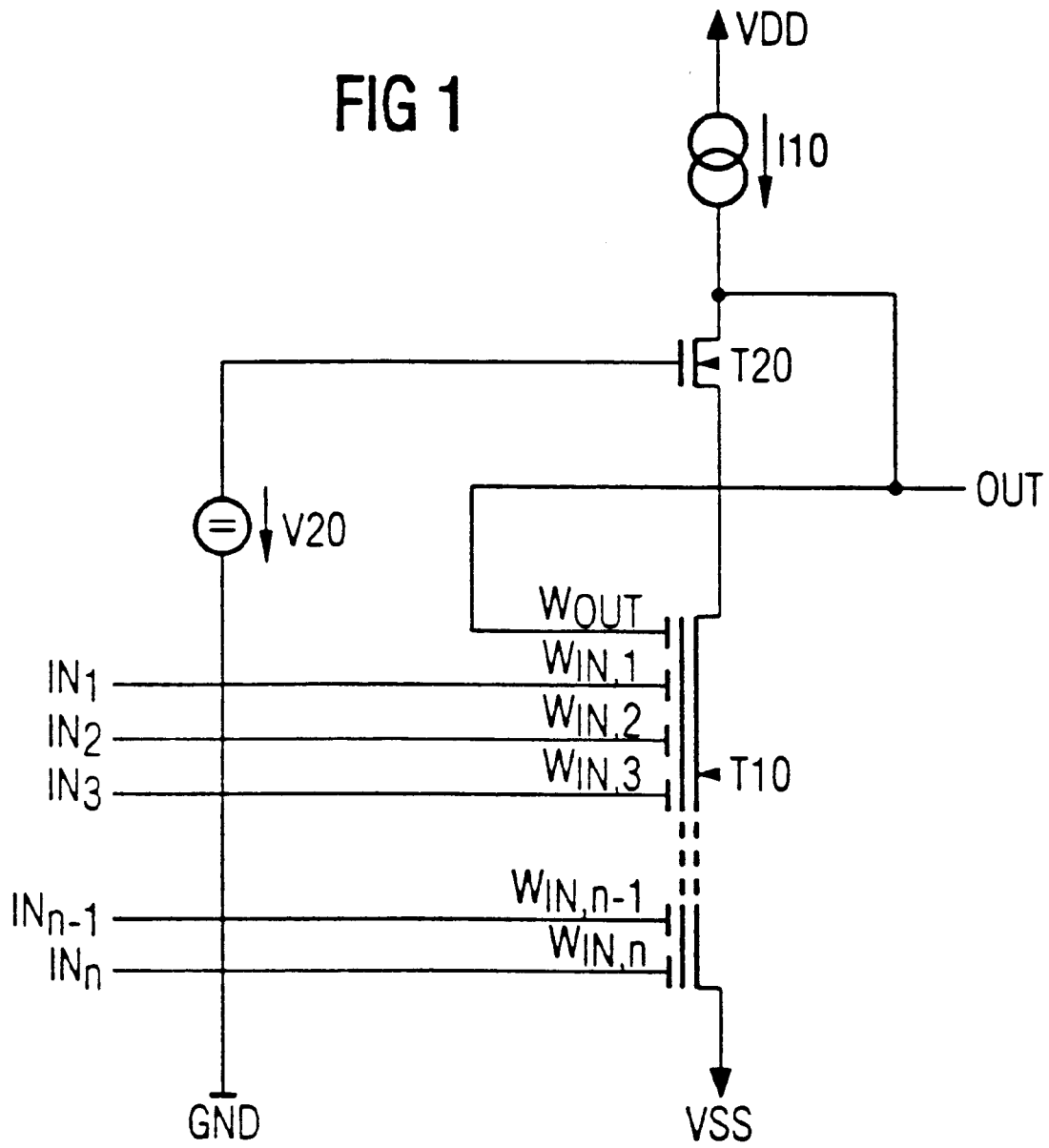
FIG. 1 shows an amplifier that is linear with respect to the large signal, with a neuron MOS transistor.

FIG. 1 shows an amplifier circuit that is linear with respect to the large signal, with an neuron MOS transistor comprising n inputs. Given symmetrical supply voltages, its transmission function is $$V_{OUT} = \frac{1}{W_{OUT}} \cdot V_0 - \sum_{i=1}^{n} \frac{W_{IN_1 i}}{W_{OUT}} \cdot V_{IN_1 i} \quad (1)$$

$V_{OUT}$ thereby stands for the output voltage of the circuit and $V_{IN,i}$ stands for the input voltage at the I-th input of the circuit $IN_i$. The parameters $w_{IN,i}$ stand for what is known as the weighting of the respective coupling gates, which are calculated via the ratio of the coupling capacity $C_{IN,i}$ between the input $IN_i$ and the floating gate and the sum $C_{ges}$ of all capacitances of which one electrode represents the floating gate:

$$w_{IN,i} = \frac{C_{IN,i}}{C_{ges}} \quad (2)$$

and $$C_{ges} = C_{FG} + \sum_{i=1}^{n} C_{IN,i} \quad (3)$$

The parameter $C_{FG}$ in equation (3) thereby stands for the capacitance between the floating gate and the channel region, including the source-drain overlap capacitances. A definition analogous to that of the parameters $w_{IN,i}$ holds for the parameter $w_{OUT}$ which represents the weighting of the coupling gate connected with the amplifier output OUT.

If a possible process-caused charging of the floating gate to a potential $V_{QP}$ and a potential contribution $V_{CH}$, coupled in via the channel region, are also taken into account, there results a floating gate level $$V_{FG} = V_{QP} + \sum_{i=1}^{n} w_{IN,i} \cdot V_{IN,i} + w_{OUT} \cdot V_{OUT} + V_{CH} \quad (4)$$

from the solution of this equation for $V_{OUT}$ and the combination of the voltages $V_{FG}$, $V_{QP}$ and $V_{CH}$ to the zero point voltage $$V_0 = V_{FG} - V_{QP} - V_{CH} \quad (5)$$

schematically shows the output voltage VOUT according to equation (1) as a function of the weighted sums of the input signals for various values $V_0$. The zero point voltage $V_0$ thereby indicates the axis segment in which the transmission function according to equation (1) intersects the ordinate, on which the weighted sum of the input signals is here plotted. In many applications, it is desirable or necessary to be able to assign a particular value to the zero point voltage $V_0$. In many applications, this will be the value $V_0=0$ V. This corresponds to a setting of the operating point of the amplifier circuits or, respectively, to a compensation of the DC portion of the transmission function according to equation (1).

Figure 3:
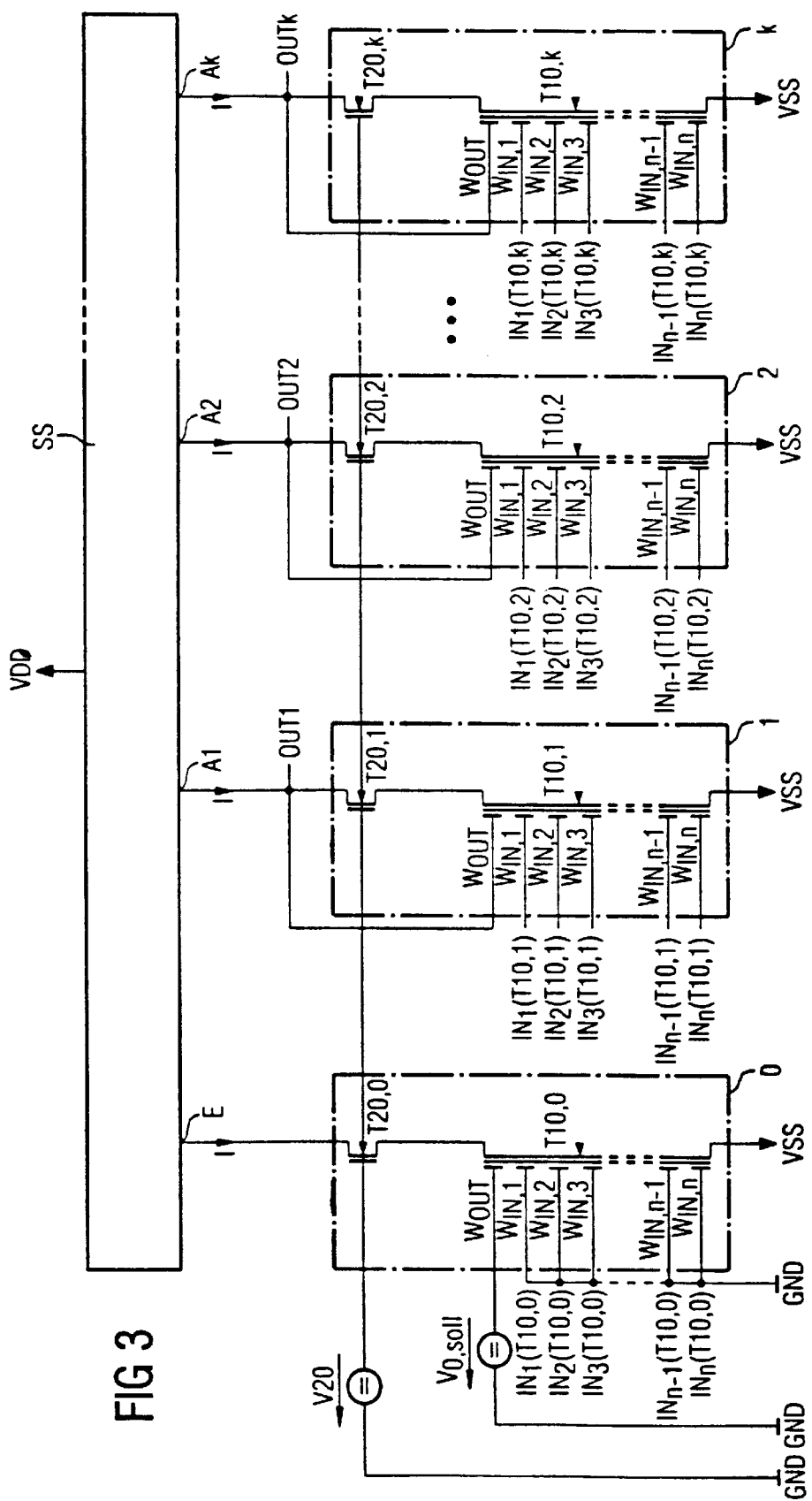
FIG. 3 shows a first construction of the inventive device with k amplifiers according to FIG. 1.

FIG. 3 shows as an example a first construction of the inventive device in which identical blocks 0 . . . k, respectively of a series circuit of an n-channel MOS transistor T20,0 . . . T20,k and of a respective neuron MOS transistor T10,0 . . . T10,k, as well as a multiple current mirror circuit SS, are provided. All gates of the transistors T20,0 . . . T20,k are connected with a voltage source V20, and a respective first terminal of the blocks, which at the same time forms a first terminal of the neuron MOS transistor, is connected with the negative supply voltage VSS. The second terminal of the block 0, which at the same time forms a second terminal of the n-channel MOS transistor T20,0, is connected with an input E of the multiple current mirror SS. The respective second terminals, which at the same time form the second terminals of the respective n-channel MOS transistors T20,1 . . . T20,k, are connected with the respective outputs A1 . . . Ak of the multiple current mirror. The block 0 is connected in such a way that the gate of the neuron MOS transistor with the output weighting $w_{out}$ receives the target value $V_{0,soll}$ of the zero point voltage, and all gates with the input weightings $w_{IN,1} \ldots w_{IN,n}$ receive reference potential. The block 0 connected in this way forms a controlled current sink that draws a current I at the input E that is dependent on the predetermined target value $V_{0,soll}$ of the zero point voltage.

To the extent that the blocks 0 . . . k all comprise the same layout, the topology of the immediate environment of the blocks 0 . . . k is identical, and the distance of these blocks from one another on the chip is not too large, it can be assumed that the voltage $V_{QP}$ caused by the process-caused charging of the floating gate is equal in the equations (4) and (5) for all stages or, respectively, neuron MOSFETs T10,0 . . . T10,k. Under the assumption that all amplifier stages are operated with the same cross-current I, this means that the same voltage $V_0$ arises for all stages.

Under the condition $$\sum_{i=1}^{n} \frac{w_{IN,i}}{w_{OUT}} \cdot V_{IN,i}(T10, j) = 0 \quad (7)$$

i.e., that at the inputs of an amplifier stage j=1 . . . k the contribution of the input signals $V_{IN,i}$ (T10,j) is identical to the contribution of the input signals $V_{IN,i}$(T10,0) in block 0, namely 0, the voltage $V_{OUT}=V_0$ must necessarily arise at the output of an amplifier stage for which the equation (7) is fulfilled, since the respective neuron MOS transistor T10,j of an amplifier stage j-1 . . . k is then located in exactly the same operating point as the neuron MOS transistor T10,0 in the block 0.

The preconditions additionally introduced above practically present no limitation, since for a given amplifier stage whose neuron MOS transistor is configured in a particular way it is always possible to construct a suitable current sink via layout measures, i.e. via a copy of a block and a corresponding alteration of the connection of the coupling gates.

If several amplifier stages are used in one circuit, which however are all configured differently, or else which are very far apart from one another on the chip for certain reasons, a separate current sink must be built into each amplifier circuit. In this case as well, the advantages of neuron MOS amplifiers in comparison with known solutions are obtained, i.e. in particular their low space and power consumption.

Figure 4:
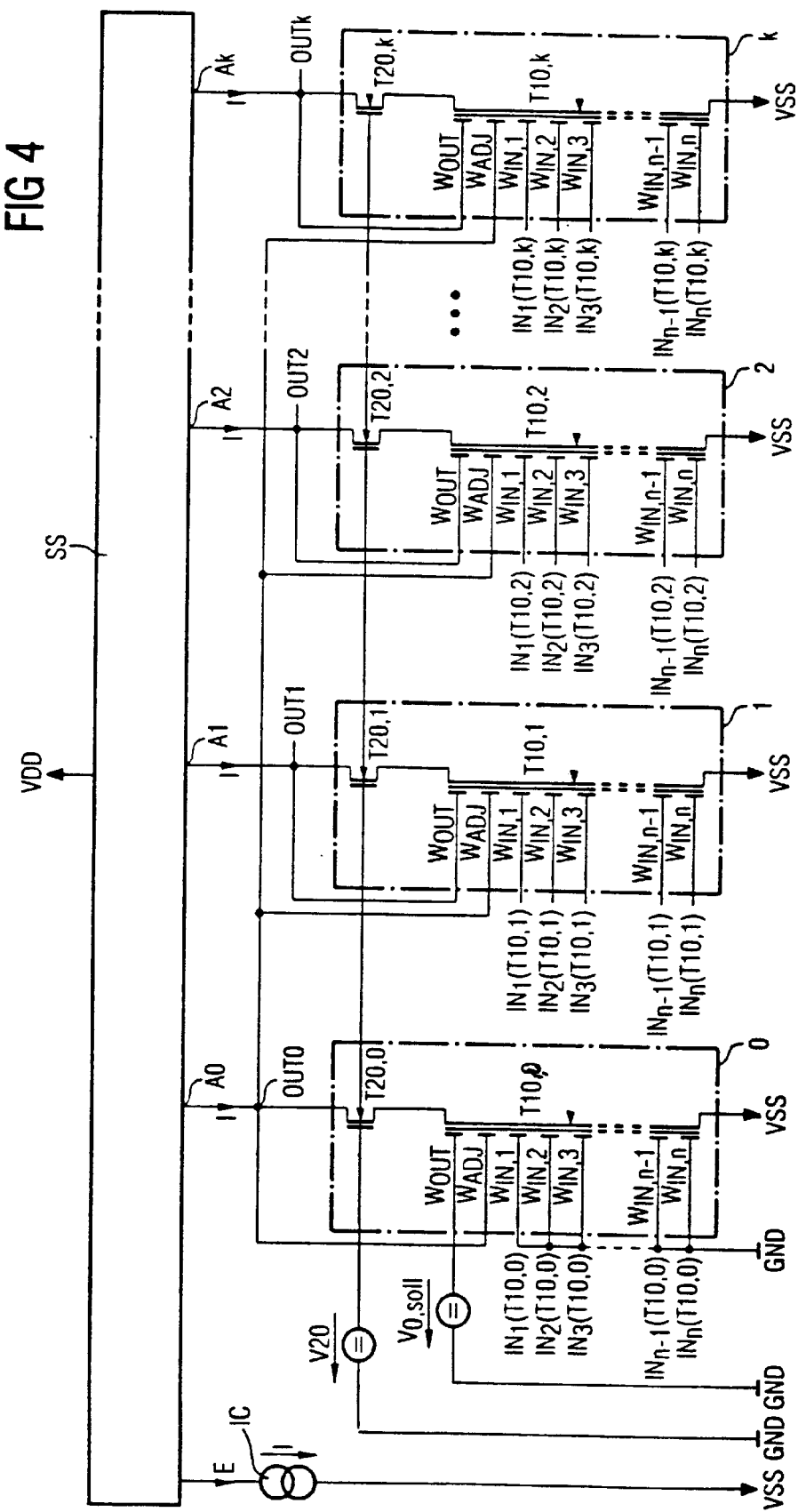
FIG. 4 shows a second construction of the inventive device with k amplifiers according to FIG. 1.

FIG. 4 shows a second construction of the invention, which differs from the one shown in FIG. 3 in that an additional gate with an adjustment weighting $W_{ADJ}$ is respectively provided for the neuron MOS transistors T10,0 . . . T10,k, and all these additional gates are connected with an additional output A0 of the current mirror SS, and in that in block 0 the terminal of the transistor T20,0 is not connected with the current mirror input E, but rather with the additional output A0, and that in place of the block 0 a constant current sink IC draws a current I.

From a circuit-oriented perspective, the circuits in FIG. 3 and FIG. 4 differ with respect to their principle of operation in that the stage 0 in FIG. 3 itself generates a reference current, which is then mirrored as precisely as possible via the current mirror SS and must be impressed onto the stages 1 . . . k. In contrast, in FIG. 4 a current that is equal for all stages and is also predetermined is impressed on all stages, i.e. on the stages 1 . . . k, and in particular also on the reference stage 0. Here the stage 0 accordingly cannot operate as a reference current generator, since a current is predetermined for it; rather, it functions as a reference voltage generator, whereby the reference voltage it produces is supplied to the further stages 1 . . . k, as described above. This difference has consequences with respect to the demands on the current mirror SS: While in FIG. 3 a circuit SS is necessary that has an exact current mirror characteristic, in the circuit according to FIG. 4 it is necessary only to fulfill the requirement that a current source circuit be present that provides the same current at all its outputs. This means in particular that in FIG. 4, in place of an exact current mirror SS, in principle all circuits can be used that produce the same output currents using an arbitrary reference quantity k+1, which output currents are supplied to the stages 0 . . . k. It is thereby sufficient if the functional connection between the reference quantity and the output currents is known only approximately and is not described by an exact mirror relationship. As will be discussed later in connection with FIGS. 6–8, there are circuits that derive the reference for exactly equal output currents from a current impressed at the input side, but whose ratio between the input current and the output current does not exhibit the exact characteristic required by current mirror circuits.

The incorporation of such a coupling gate, with the weighting $W_{ADJ}$, into a neuron MOS amplifier according to FIG. 1 does have the effect that the absolute values of the weightings $w_{IN,i}$ with $I=1 \ldots n$ and $w_{OUT}$ decrease, but the ratios $w_{IN,i}/w_{IN,m}$ ($I, m=1 \ldots n$) or, respectively, $w_{IN,i}/w_{OUT}$ ($I=1 \ldots n$) remain preserved.

This connection has the effect that, as desired, the voltage $V_0$ in the transmission function of all amplifier stages $1 \ldots k$ takes on the target value $V_{0,soll}$, which is established by the following calculation:

If the system of equations (1) . . . (5) in the present case modifies the amplifier stages in FIG. 4 expanded by a further coupling gate with the weighting $w_{ADJ}$, the following output voltages result for the amplifier stages in the blocks $1 \ldots k$:

$$V_{OUT,i} = \frac{1}{W_{OUT}} \cdot V_0 - \frac{W_{ADJ}}{W_{OUT}} \cdot V_{OUT,0} - \sum_{i=1}^{n} \frac{W_{IN,i}}{W_{OUT}} \times V_{IN,i}(T10, j) \quad (8)$$

with $$W_{INi} = \frac{C_{IN,i}}{C_{ges}}, \quad W_{ADJ} = \frac{C_{ADJ}}{C_{ges}}, \quad W_{OUT} = \frac{C_{OUT}}{C_{ges}} \quad (9)$$

and $$C_{ges} = C_{FG} + C_{ADJ} + \sum_{i=1}^{n} C_{IN,i} \quad (10)$$

Equations (9) and (10) likewise hold for T10,0; the relations analogous to equation (8), i.e. the transmission function of T10,0, is:

$$V_{OUT,0} = \frac{1}{W_{ADJ}} \cdot V_0 - \frac{W_{OUT}}{W_{ADJ}} \cdot V_{0,sol} - \sum_{i=1}^{n} W_{in,i}/W_{ADJ} \cdot V_{IN,i}(T10, 0) \quad (11)$$

Since the inputs $IN_i(T10,0)$ are all connected with the GND potential=0 V, the sum in equation (11) supplies no contribution, so that equation (11) can be simplified to $$V_{OUT,0} = \frac{1}{W_{ADJ}} \cdot V_0 - \frac{W_{OUT}}{W_{ADJ}} \cdot V_{0,soll} \quad (12)$$

Substitution of equation (12) in equation (8) yields $$V_{OUT,j} = V_{0,soll} - \sum_{i=1}^{n} \frac{W_{IN,i}}{W_{OUT}} \times V_{IN,i}(T10, j) \quad (13)$$

i.e. the desired transmission function for the amplifier stages $1 \ldots k$.

Figure 5:
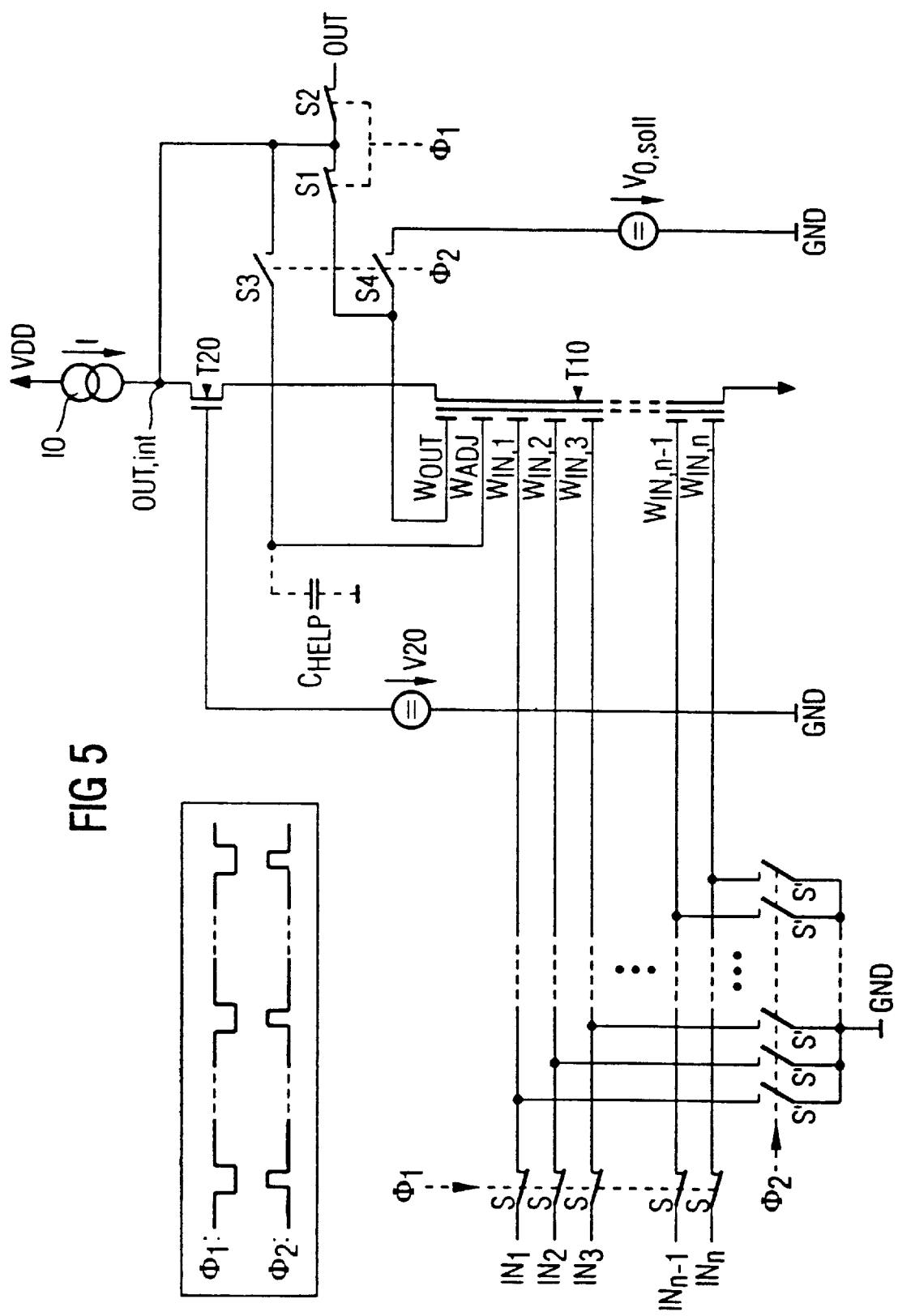
FIG. 5 shows a third construction of the inventive device based on an amplifier according to FIG. 1.

FIG. 5 shows a third construction of the inventive device in which the direct voltage portion of the transmission function or, respectively, the zero point voltage $V_0$ ensues by means of feedback and subtraction of the output voltage, carried out periodically. In a way similar to FIG. 4, the neuron MOSFET T10 of the amplifier stage is expanded in relation to the amplifier stage in FIG. 1 by an additional coupling gate with the weighting $w_{ADJ}$. The weighting $w_{ADJ}$ is thereby exactly as large as the weighting $w_{OUT}$.

A capacitor $C_{HELP}$, which serves for the storage of a voltage value, can be connected parallel to the weighting gate with the weighting $w_{ADJ}$, against GND or against another constant voltage level. However, this measure is not absolutely required for operation, since the coupling gate with the weighting $w_{ADJ}$ alone can also already serve as the storage capacitor.

Switches S, which enable a separation of the inputs from the coupling gates, are inserted between the inputs $IN_1 \ldots IN_n$ and the associated coupling gates. These switches S are controlled by a signal $\Phi_1$. For further explanations, with respect to the switch S it should be the case that it is closed by an H level and opened by an L level. Also, additional switches S', which are controlled by a signal $\Phi_2$ and via which the potential of the coupling gate can be connected with GND, are located at each coupling gate that can be connected with an input. Via a switch S1 driven with the signal $\Phi_1$, a drain node OUT,int of the transistor T20 can be connected with the output OUT of the circuit, and via a switch S2 that is likewise controlled with the signal $\Phi_1$ the drain node OUT,int of the transistor T20 can be connected with the coupling gate with the weighting $w_{OUT}$. The node OUT,int can in addition be connected with the coupling gate with the weighting $w_{ADJ}$ via a switch S3 controlled via the signal $\Phi_2$, and an additional switch S4 controlled via the signal $\Phi_2$ can connect the coupling gate with the weighting $w_{OUT}$ with a voltage source that supplies the target value $V_{0,soll}$ of the zero point voltage of the transmission function.

If the circuit is operated with the pulse schema, likewise drawn into the circuit diagram, for the signals $\Phi_1$ and $\Phi_2$, the circuit has the desired transmission function during the phases in which $\Phi_1$ has the H level. During the phases in which the signal $\Phi_2$ takes on the H level, the transmission function is again compensated anew each time.

The compensation takes place by storing a particular potential value at the coupling gate with the weighting $w_{ADJ}$ or, respectively, at the capacitor that results from the parallel connection of this coupling gate and the capacitor $C_{HELP}$, which potential value causes the adjustment of the transmission function, as is explained in more detail below. It is necessary to carry out this compensation periodically, since, due to the non-ideality of real switches S, the charge located at the coupling gate with the weighting $w_{ADJ}$, including the optionally present capacitor $C_{HELP}$ connected in parallel, can change during the operation of the circuit, due to leakage currents over the switch S that connects this coupling gate with the node OUT,int. The clock frequency of the adjustment periodically carried out thus depends on the quality of the switch with respect to its leakage characteristics in the switched-off state and on the requirements of precision of the entire circuit.

For a time at which $\Phi_2$ is at the H level and $\Phi_1$ is at the L level, the transmission function is:

$$V_{OUT,int}(\Phi_2 = H) = \frac{1}{W_{ADJ}} \cdot V_0 - \frac{W_{OUT}}{W_{ADJ}} \cdot V_{0,soll} - \sum_{i=1}^{n} \frac{W_{IN,i}}{W_{ADJ}} \cdot V_{IN} \quad (14)$$

Since the coupling gates with the weightings $w_{IN,i}$, $I=1 \ldots n$, are all connected with GND potential=0 V, the sum in equation (14) makes no contribution, so that equation (14) can be simplified to $$V_{OUT,int}(\Phi_2 = H) = \frac{1}{W_{ADJ}} \cdot V_0 - \frac{W_{OUT}}{W_{ADJ}} \cdot V_{0,soll} \quad (15)$$

The node with which the coupling gate with the weighting $w_{ADJ}$ is connected is thus charged to the voltage $V_{OUT,int}$ ($\Phi_2$=H). If $\Phi_2$ again takes on the L level, this potential is maintained at this node. If $\Phi_1$ thereupon takes on the H level, the overall stage has the transmission function $$V_{OUT} = V_{OUT,int}(\Phi_1 = H) = \quad (16)$$

$$\frac{1}{W_{OUT}} \cdot V_0 - \frac{W_{ADJ}}{W_{OUT}} \cdot V_{OUT,int}(\Phi_2 = H) - \sum_{i=1}^{n} \frac{W_{IN,i}}{W_{OUT}} \cdot V_{IN,i}$$

Given the dimensioning $w_{ADJ}$=$w_{OUT}$ introduced above, substitution of equation (15) into equation (16) yields the desired transmission function:

$$V_{OUT}(\Phi_1 = H) = V_{0,soll} - \sum_{i=1}^{n} \frac{W_{IN,i}}{W_{OUT}} \cdot V_{IN,i} \quad (17)$$

The advantage of the construction of the inventive device according to FIG. 5 is that no additional reference neuron MOSFET T10,0 is required for which the precondition must be fulfilled that the process-caused charging of its floating gate is exactly as large as the charging of the floating gates of the neuron MOSFETs in the actual amplifier stages of blocks 1 . . . k.

Alongside the precondition that the process-caused charging of the floating gate in the respective reference stages is exactly as large as the charging of the floating gates of the neuron MOSFETs in the actual amplifier stages, for the circuits according to FIG. 3 and FIG. 4 the precondition must be fulfilled that the geometries of the transistors agree with one another as far as possible. Due to statistical fluctuations, called matching errors, small differences in the dimensions characteristic for the transistors are however always present, despite identical layouts. In this connection, in the circuit according to FIG. 5 it is advantageous that no reference neuron MOSFET is used, and matching problems thus cannot be a factor.

A combination in which, as shown in FIG. 5, a stage operates, by means of switching over, both as an adjustment stage and also as an amplifier stage, and in which further amplifier stages, as shown in FIG. 3 or 4, are simultaneously adjusted, is likewise possible.

Figure 6:
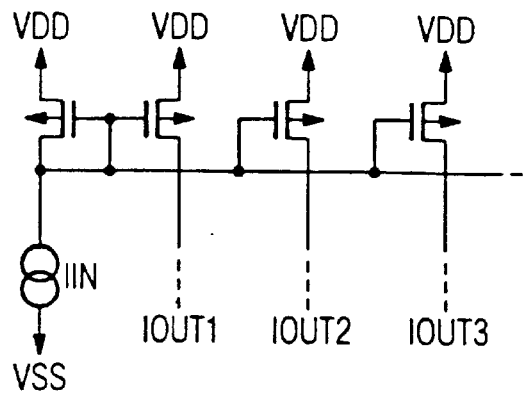
FIGS. 6 and 7 show exemplary embodiments of the multiple current mirror SS in FIGS. 3 and 4.
Figure 7:
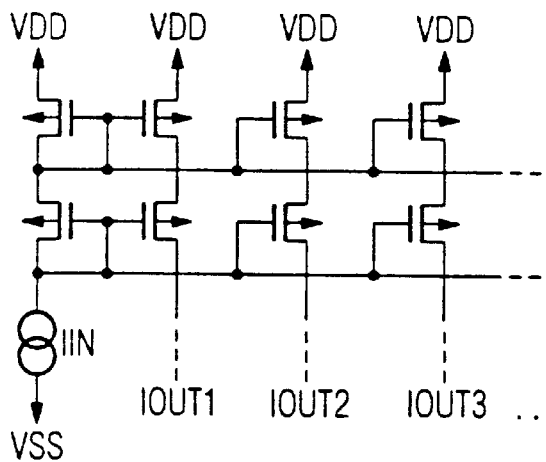

FIGS. 6 and 7 show exemplary embodiments for the multiple current mirror SS of FIGS. 3 and 4, whereby FIG. 6 shows a detail circuit of a simple multiple current mirror and FIG. 7 respectively shows a detail circuit of a cascaded multiple current mirror. These two circuits differ in that the circuit according to FIG. 7 has an essentially higher output resistance, and thereby has an essentially lower dependence of the output current on the voltage present at the current source output than the circuit according to FIG. 6, which has an advantageous effect on the linearity of the amplifier stages. Nonetheless, in the circuit according to FIG. 6 the required least voltage drop between VDD and output is smaller than in the circuit according to FIG. 7, which in turn increases the controllability of the amplifier stages.

Figure 8:
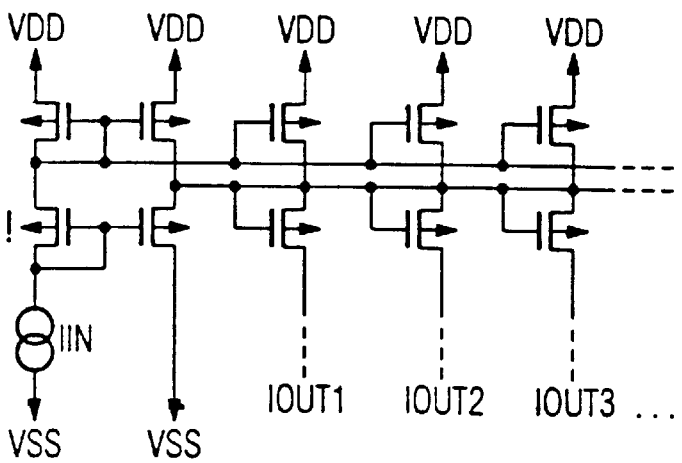
FIG. 8 shows an exemplary embodiment of a multiple current source circuit that is likewise possible in place of the current mirror SS in FIG. 4.

FIG. 8 shows a current source circuit with an arbitrary number of identical outputs. It is hereby to be remarked that in the circuit of FIG. 8 a transistor is identified with "!" whose transistor width is only 0.1 to 0.25 of the transistor width otherwise used.

The principle of operation of this circuit has the effect that on the one hand it has a fairly large output resistance, whereby the required minimum voltage drop between VDD and output is however considerably smaller than in the case of the circuit according to FIG. 7. In addition, however, the principle of operation of this circuit has the effect that while all output currents are identical, they never fully achieve the magnitude of the input current. However, corresponding to the discussion of the function of the current mirror SS in the circuit according to FIG. 4, the last-named characteristic does not result in a limitation in this case, so that the circuit according to FIG. 8, due to its good characteristic for combining a high output resistance with a small required least voltage drop between VDD and output, is excellently suited for use in the circuit according to FIG. 4.

Of course, it is possible to construct all the devices shown in the figures in complementary fashion as well, whereby the terminals VDD and VSS must be exchanged and the n-channel types used must be replaced with p-channel types.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A device for self-adjusting setting of an operating point in amplifier circuits with neuron MOS transistors, comprising:

an adjustment stage and at least one amplifier stage of substantially identical construction thereto;

each of the adjustment stage and at least one amplifier stage having a series circuit of a MOS field effect transistor and a neuron MOS transistor, all gates of the MOS transistors connected to a common voltage source;

each of the adjustment stage and the at least one amplifier stage are connected such that an equally large current flows therethrough;

a reference potential connected to input gates of the neuron MOS transistor in the adjustment stage;

input gates of the at least one amplifier stage being amplifier inputs;

a feedback gate of the neuron MOS transistor in the adjustment stage connected to a voltage source that supplies a target value for a zero point voltage of the at least one amplifier stage; and a feedback gate of the transistor in the at least one amplifier stage fed back to an output of the at least one amplifier stage.

2. The device according to claim 1, wherein an equally large current in the adjustment stage and in the at least one amplifier stage is produced by a multiple current mirror with an input and at least one output, and wherein an input of the multiple current mirror is connected to the adjustment stage, and wherein at least one output of the multiple current mirror is connected to the at least one amplifier stage.

3. The device according to claim 1, wherein an equally large current is produced in the adjustment stage and in the at least one amplifier stage by one of a multiple current mirror or a current source circuit with an input, a first output and at least one additional output, and wherein an input of the multiple current mirror or of the current source circuit is connected to a current source that supplies the current, and wherein the adjustment stage is connected to the first output of the multiple current mirror or the current source circuit, and wherein one of the at least one further outputs of the multiple current mirror or of the current source circuit is connected to a respective amplifier stage of the at least one amplifier stage, and wherein each of the neuron MOS transistors of the adjustment stage and of the at least one amplifier stage have an additional adjustment gate that is connected with the output of the adjustment stage.

4. The device according to claim 1, wherein the device has electronic switches and wherein using electronic switches, one of the at least one amplifier stages is switched at regular time intervals as an adjustment stage, wherein the input gates of the neuron MOS transistor are switchable selectively either to inputs of the amplifier stage or to reference potential, wherein an adjustment gate of the neuron MOS transistor can be switched to an internal output of the amplifier stage and a feedback gate is switchable to a voltage source with a target value of a zero point voltage, and wherein an internal output can be switched to the feedback gate and to an external output of the amplifier stage.

5. A device for self-adjusting setting of an operating point in amplifier circuits with neuron MOS transistors, comprising:

an adjustment stage and at least one amplifier stage of substantially identical construction thereto;

each of the adjustment stage and at least one amplifier stage having a series circuit of an MOS field effect transistor and a neuron MOS transistor, all gates of the MOS transistors connected to a common voltage source;

each of the adjustment stage and the at least one amplifier stage are connected such that an equally large current flows therethrough;

a reference potential connected to input gates of the neuron MOS transistor in the adjustment stage;

input gates of the at least one amplifier stage being amplifier inputs;

a feedback gate of the neuron MOS transistor in the adjustment stage connected to a voltage source that supplies a target value for a zero point voltage of the at least one amplifier stage;

a feedback gate of the transistor in the at least one amplifier stage fed back to an output of the at least one amplifier stage; and a multiple current mirror that produces an equally large current in the adjustment stage and in the at least one amplifier stage, the multiple current mirror having an input and at least one output, an input of the multiple current mirror connected to the adjustment stage, and at least one output of the multiple current mirror connected to the at least one amplifier stage.

6. A device for self-adjusting setting of an operating point in amplifier circuits with neuron MOS transistors, comprising:

an adjustment stage and at least one amplifier stage of substantially identical construction thereto;

each of the adjustment stage and at least one amplifier stage having a series circuit of an MOS field effect transistor and a neuron MOS transistor, all gates of the MOS transistors connected to a common voltage source;

each of the adjustment stage and the at least one amplifier stage are connected such that an equally large current flows therethrough;

a reference potential connected to input gates of the neuron MOS transistor in the adjustment stage;

input gates of the at least one amplifier stage being amplifier inputs;

a feedback gate of the neuron MOS transistor in the adjustment stage connected to a voltage source that supplies a target value for a zero point voltage of the at least one amplifier stage; and a feedback gate of the transistor in the at least one amplifier stage fed back to an output of the at least one amplifier stage;

a current source that produces an equally large current in the adjustment stage and in the at least one amplifier stage, the current source having an input, a first output and at least one additional output, the adjustment stage connected to the first output of the current source, and one of the at least one further outputs of the current source connected to a respective amplifier stage of the at least one amplifier stage, each of the neuron MOS transistors of the adjustment stage and of the at least one amplifier stage having an additional adjustment gate that is connected with the output of the adjustment stage.

* * * * *